(12) United States Patent
Lu

(10) Patent No.: US 11,622,477 B2
(45) Date of Patent: Apr. 4, 2023

(54) PASSIVE HEAT DISSIPATION AC POWER SUPPLY FOR IT EQUIPMENT

(71) Applicant: AA Power Inc., Boston, MA (US)

(72) Inventor: Qun Lu, Lexington, MA (US)

(73) Assignee: AA Power Inc., Boston, MA (US)

( * ) Notice: Subject to any disclaimer, the term of this patent is extended or adjusted under 35 U.S.C. 154(b) by 0 days.

(21) Appl. No.: 17/683,523

(22) Filed: Mar. 1, 2022

(65) Prior Publication Data

US 2022/0369494 A1 Nov. 17, 2022

Related U.S. Application Data

(60) Provisional application No. 63/290,387, filed on Dec. 16, 2021, provisional application No. 63/272,877, filed on Oct. 28, 2021, provisional application No. 63/232,298, filed on Aug. 12, 2021, provisional application No. 63/189,903, filed on May 18, 2021, provisional application No. 63/188,568, filed on May 14, 2021.

(51) Int. Cl.
*H05K 7/20* (2006.01)
*H05K 7/14* (2006.01)
*G06F 1/20* (2006.01)
*G06F 1/26* (2006.01)

(52) U.S. Cl.
CPC .............. *H05K 7/209* (2013.01); *G06F 1/206* (2013.01); *H05K 7/1492* (2013.01); *H05K 7/20409* (2013.01); *G06F 1/26* (2013.01)

(58) Field of Classification Search
None
See application file for complete search history.

(56) References Cited

U.S. PATENT DOCUMENTS

| 9,380,702 | B2 * | 6/2016 | Fricker | G06F 1/183 |
|---|---|---|---|---|
| 9,474,189 | B2 * | 10/2016 | Kawauchi | H05K 7/20436 |
| 9,693,446 | B2 * | 6/2017 | Ragg | H05K 1/0212 |
| 10,159,166 | B2 * | 12/2018 | Ikeda | H01R 12/7082 |
| 10,667,439 | B1 * | 5/2020 | Song | H05K 7/209 |
| 2013/0021755 | A1 | 1/2013 | Lui et al. | |
| 2013/0120940 | A1 * | 5/2013 | Landau | H01L 23/49811 |
| | | | | 361/752 |
| 2013/0265714 | A1 | 10/2013 | Tsao | |
| 2017/0086289 | A1 * | 3/2017 | Takahashi | H02M 1/14 |
| 2017/0147017 | A1 * | 5/2017 | Ishii | G05D 23/1917 |
| 2017/0373637 | A1 * | 12/2017 | Kondo | H03H 9/08 |
| 2021/0081009 | A1 * | 3/2021 | Edwards | H01L 23/38 |
| 2021/0344194 | A1 * | 11/2021 | Pachoud | H02G 15/113 |

(Continued)

FOREIGN PATENT DOCUMENTS

| JP | 2002217574 A | 8/2002 |
|---|---|---|
| JP | 2007185002 A | 7/2007 |
| JP | 2019102533 A | 6/2019 |

*Primary Examiner* — Courtney L Smith
(74) *Attorney, Agent, or Firm* — Occhiuti & Rohlicek LLP

(57) ABSTRACT

An apparatus comprising an ac/dc power supply for providing power to power consumers in an internet data center or to a stand-alone server includes power-handling circuitry and a passive heat-dissipation system that passively dissipates heat generated by the power-handling circuitry. The passive heat-dissipation system comprises a housing that encloses that power-handling circuitry and a thermal network that provides thermal communication between the power-handling circuitry and faces of the housing.

30 Claims, 11 Drawing Sheets

(56) References Cited

U.S. PATENT DOCUMENTS

2022/0007544 A1\* 1/2022 Embleton ............... G06F 1/206
2022/0026967 A1\* 1/2022 Gu ........................ G06F 1/3215
2022/0078267 A1\* 3/2022 Nixon ..................... H04L 69/14

\* cited by examiner

PASSIVE HEAT DISSIPATION AC POWER SUPPLY FOR IT EQUIPMENT

RELATED APPLICATIONS

This application claims the benefit of the Dec. 16, 2021 priority date of U.S. Provisional Application 63/290,387, the Aug. 12, 2021 priority date of U.S. Provisional Application 63/232,298, the May 18, 2021 priority date of U.S. Provisional Application 63/189,903, the May 14, 2021 priority date of U.S. Provisional Application 63/188,568, and the Oct. 28, 2021 priority date of U.S. Provisional Application 63/272,877. All of the foregoing applications are hereby incorporated by reference.

TECHNICAL FIELD

The invention concerns power supplies, and in particular, to cooling a power supply for IT equipment, such as that found at a data center, examples of which include servers, switches, and routers.

BACKGROUND

A side effect of generating power through power supplies is the generation of heat by the various circuits that convert AC to DC. Since excessive heat accumulation is undesirable, it is usual to provide a cooling mechanism. A typical power supply uses a fan to promote heat dissipation.

Fans are commonly used to cool power supplies. However, fans increase both the cost of the power supply as well as its power consumption. Power supply fans are also vulnerable to breaking down. This can lead to field failures.

Although a fan is effective at heat dissipation, it carries some disadvantages. First, the fan itself has a cost. Secondly, the fan requires additional power to spin. Third, the fan, like any mechanical part, is vulnerable to breakdown. Fourth, the fan draws air into the power supply, which in turn means that the components are exposed to dust, moisture, and other undesirable objects. And fifth, a fan creates noise. When many servers are present, this noise can be deafening.

It is also possible to use a liquid cooling system in lieu of a fan. While this avoids the problems of dust, a liquid cooling system is also vulnerable to breakdown. For example, in a liquid cooling system, one replaces the fan with a liquid pump, which, like a fan, can break down and also consume power. Moreover, the need to provide coolant and piping to convey the coolant imposes considerable cost and creates further opportunities for failure, for example due to leakage. This further increases the cost associated with liquid cooling.

Of all the components one finds in a typical data center, the ac/dc power supply is by far the most vulnerable to failure. The expected lifetime of an ac/dc power supply is significantly shorter than that of other data center equipment. This is particularly unfortunate because failure of a power supply has a cascading effect. When a power supply fails, everything that relies on that power supply also fails.

To make matters worse, the act of replacing a failed power supply is a costly one. Based on labor and equipment cost and lost productivity, it has been estimated that the cost of replacing a failed power supply is at least twice or even four times as much as the cost of the power supply itself. Added to this is the additional effort required to make a power supply hot-swappable.

The circuitry that forms the power supply is not, in itself, unreliable. The culprit is, in most cases, the reliance on an active cooling system that moves a fluid, whether the fluid be in gaseous form, in which case one uses a fan, or whether it be in liquid form, in which case one uses a pump. Were it not for the active cooling system, and its proclivity for failure, a power supply's lifetime could be extended significantly.

Unfortunately, it is difficult to eliminate either the fan or some other active cooling mechanism that relies on a mechanical part, such as a fan or a pump, that is prone to failure. The difficulty in eliminating such a part arises from the sheer quantity of heat that is produced during normal operation of a power supply. This is because the rate at which heat is generated relative to the rate at which it is dissipated is such that the steady-state solution to the heat equation places the components at a temperature that is higher than their operating temperature.

The semiconductor devices that populate a typical power supply are notoriously sensitive to temperature. For example, certain fundamental material properties of semiconductors, such as charge-carrier mobility, are strongly dependent on temperature. Thus, it has been found that, without some active movement of cooling fluid, whether that fluid be gas or liquid, the equilibrium temperature of the components during normal operation settles at a point that is high enough for the components to fail.

SUMMARY

The invention effectively eliminates the fluid middleman by carrying out heat dissipation passively using solid-state components to rapidly conduct heat to multiple faces of a housing so that it can quickly be radiated away.

In one aspect, the invention features an ac/dc power supply for providing power to power consumers in an internet data center or to a stand-alone server. As used herein, the term "power consumer" is intended to include such devices as servers, including stand-alone servers, switchers, switches, and routers. Such a power supply includes power-handling circuitry and a passive heat-dissipation system that passively dissipates heat generated by the power-handling circuitry. The passive heat-dissipation system comprises a housing that encloses the power-handling circuitry and a thermal network that provides thermal communication between the power-handling circuitry and faces of the housing.

Embodiments include those in which the thermal network comprises a printed-circuit board and at least one thermally-conductive medium disposed between the printed-circuit board and the housing. Examples of such a medium include a paste or sponge or another pliable or flexible material that conforms easily to irregular surfaces and fills gaps between irregular surfaces. Among these are embodiments in which only one thermally-conductive medium is used. Also among these are embodiments in which two or more thermally-conductive media are used.

Other embodiments include those in which the thermal network comprises a printed-circuit board having an opening and in which the power-handling circuitry comprises a power unit that has a portion that passes through the opening so as to be in thermal communication with the housing.

In some embodiments, the thermal network includes a conducting region, such as a strip, that has been inlaid into a face of the housing, such as into a recess formed in the housing's face. In such embodiments, the conducting strip has a thermal conductivity that is greater than that of the housing.

In yet other embodiments, the thermal network comprises a printed-circuit board. Among these are embodiments in which the printed-circuit board includes one or more heat-conducting layers. In such embodiments, the power-handling circuitry comprises one or more power units that are surface mounted onto the printed-circuit board. These power units inevitably create localized regions of elevated temperature during operation thereof. A multilayer printed-circuit board to which these power units have been surface mounted has a tendency to spread the heat energy that is concentrated in these regions of elevated temperature and to ultimately conduct this heat energy to the housing through a thermally-conductive medium, so that it can ultimately dissipated passively into the environment, without the need for a fan or another mechanical contrivance. Thus, the printed-circuit board serves dual functions. It serves its conventional function of providing a place to mount various components. But, as a side effect of its ability to conduct heat energy, it is also able to play a crucial role in dissipation of heat generated by those very components that it supports. A connection between the printed-circuit board and the thermally-conductive medium thus enables the printed-circuit board to form a hub within the thermal network. As a heat-spreading hub for the thermal network, the printed-circuit board collects heat energy from multiple components and diverts it to different parts of the housing's faces for eventual passive dissipation into the environment.

Still other embodiments include those in which the thermal network comprises a projection that is in thermal communication with the housing and that projects into the housing. In such embodiments, the projection includes a thermally-conductive body having an end that is in thermal communication with a face of the housing. The power-handling circuitry comprises a power unit that is in thermal communication with the body. As a result, heat generated by the power unit is conducted to the housing through the body.

Still other embodiments feature a thermal network that comprises a projection that is in thermal communication with the housing and that projects into the housing an having a recess. In such embodiments, the power-handling circuitry comprises a power unit that is nestled in the recess, which conforms to the power unit. In some cases, the power unit is an electrolytic capacitor with a cylindrical body that can be nestled into a semicircular recess.

In still other embodiments, the thermal network comprises a grounded conducting plate that is between a power unit of the power-handling circuitry and the housing.

Among the embodiments are those in which the thermal network comprises a thermally-conductive adhesive and the power-handling circuitry comprises a power unit that is in thermal communication with the adhesive. In such embodiments, the adhesive is disposed between the power unit and the housing. As a result, the power unit is in thermal communication with the housing via the adhesive.

In still other embodiments, the thermal network comprises a perforated graphene layer and the power-handling circuitry comprises a power unit that is in thermal communication with the graphene. Preferably, a thermally-conductive material, such as a thermally-conductive adhesive or thermally-conductive sponge fills the perforations in the graphene layer, thereby promoting thermal conductivity in a direction transverse to that in which the graphene has its maximum conductivity.

Embodiments include those in which the power supply is mounted so that at least one and preferably more of its faces are in contact with a heat sink, such as a rack in a data center or an enclosure of a power consumer in a data center.

In some embodiments, the housing comprises multiple faces and the thermal network is in thermal communication with all of the faces.

Still other embodiments include those in which the housing comprises opposed faces, each of which has a vent and those that include fins on the housing.

Because the power supply's housing can become quite hot, it is useful to have a warning system. Among the embodiments are those that include a heat sensor that senses temperature of the housing. Among these are embodiments in which a warning system provides an alert in response to detecting that a temperature of the housing exceeds a threshold value.

In some embodiments, it is useful to restrict access to the power supply when it is still too hot to touch. Among these are embodiments having an access panel that is locked when a temperature of the housing is above a threshold and unlocked otherwise, wherein the access panel permits access to the power supply.

Embodiments further include those in which the power-handling circuitry comprises a power semiconductor device that is in thermal communication with the thermal network, those in which it comprises an electrolytic capacitor that is in thermal communication with the thermal network, and those in which it comprises a magnetic core and windings that are both in thermal communication with the thermal network.

In another aspect, a passive heat-dissipating ac power supply for IT equipment comprises a housing, power-handling circuitry having a power-handling unit, and thermal network comprising thermal resistors of low thermal resistance arranged inside the housing to provide thermal communication between the power-handling circuitry and the housing's wall.

The housing is a three-dimensional structure having considerable surface area. A particularly common form factor for such a housing is a rectangular prism. Such a prism has six faces, all of which are in thermal communication with each other. As such, heat transferred to any one face of the housing wall is able to ultimately radiate or otherwise dissipate into the environment through all faces of the housing wall.

By essentially converting the entire housing into a heat sink, it becomes possible to considerably magnify the housing's ability to radiate heat rapidly enough to maintain a suitable operating temperature within the power supply.

To further promote rapid heat dissipation, some embodiments feature one or more additional metal radiators that have been attached to corresponding one or more of the housing faces in such a way that thermal communication likewise exists between that face and its corresponding additional metal radiators. Among these structures are finned structures.

In some embodiments, the walls of the housing are thickened relative those of power-supply housings for comparable AC-DC power converters that rely on a fan. This promotes more rapid heat conduction throughout the housing, thus promoting a more spatially constant heat distribution throughout the housing's wall.

In some embodiments in which rack-level power architecture is to be used, the additional metal radiator takes the form of a metal rack having layers that support power supplies. In such cases, the housing contacts the rack, which is typically a metal structure that therefore efficiently conducts heat. As a result, heat energy in the housing's wall is able to be conducted into the metal rack and dissipated over a significant area.

Among other advantages, by using the above method, the power supply housing conducts the received heat into the IT equipment's application environment. This permits cooling the power supply without using any active cooling system. As a result, the power supply costs less to make and uses less power than comparable power supplies that rely on an active cooling system. Furthermore, operating noise can be significantly reduced and the lifespan and reliability of the ac power supply for IT equipment can be increased.

In some embodiments, the thermal resistors comprise a printed-circuit board, which is arranged close to an interior side of a first wall of the power supply housing and is directly or indirectly connected to the inner side wall of the power supply housing, one or a plurality of the power-handling units are arranged on a first side surface of the printed-circuit board away from the inner side of the first wall.

In some embodiments, a thermal resistor comprises a thermally-conducting medium is filled between the printed-circuit board and the first inner side wall.

In some embodiments, a thermal resistor comprises a printed-circuit board disposed close to the first inner side wall of the power supply housing has an opening. One or more side ends of the heat-conducting structure are connected to the first inner side wall to establish thermal communication. A body portion of the heat-conducting structure extends through an opening in the printed-circuit board and contacts the housing to establish thermal communication between the power-handling unit and the housing.

In some embodiments, a concave accommodating portion is formed on the main body portion of a thermally-conducting structure and a power-handling unit is at least partially embedded in the concave accommodating portion.

In some embodiments, a thermal resistor comprises a perforated printed-circuit board arranged close to an inner wall of the housing. The board includes an opening through which an end of a power-handling unit extends to provide thermal communication with the housing's wall.

In some embodiments, the power-handling unit comprises a patch-type power semiconductor element.

In some embodiments, the power-handling circuitry includes a through-hole type power semiconductor element in thermal communication with the thermal network. Among these are embodiments in which the power semiconductor element is in thermal communication with a thermally-conductive medium or the inner side wall of the power supply housing, and the pins of the second power-handling unit are inserted into the pin through holes of the printed-circuit board.

In some embodiments, the power-handling circuitry includes a power-handling unit that has a magnetic core and a winding. In such embodiments, the magnetic core is in thermal communication with the printed-circuit board. In other embodiments, the magnetic core is in thermal communication with a projection that projects into the housing and provides thermal communication with a face of the housing. In some embodiments, the windings are in thermal communication with the printed-circuit board, for example by having been soldered thereto, or connected to the second region of the projection.

In some embodiments, a thermally-conductive polymer is filled between at least part of the outer side wall of the power-handling unit and the side surface of the printed-circuit board so that the power-handling unit is in thermal communication with the housing through the thermally-conductive polymer.

In some embodiments, a heat-dissipation fins are arranged on one or more outer side walls of the power-supply housing.

Further embodiments include those that comprise a shield against electromagnetic interference by said power supply. Examples of such a shield include an enclosing conducting structure connected to ground, for example, an additional enclosure around the power supply housing with a thermally-conductive material filling the gap between them to promote heat transfer and with the enclosure and the housing being at a common potential. Embodiments include those in which the shield is a solid conducting structure and those in which it takes the form of a conductive cage and those in which it takes the form of a conductive layer. Further embodiments include those that suppress electromagnetic interference of both conductive and radiative origin and those that suppress only electromagnetic interference of conductive origin.

Still other embodiments include a heat sensor that is configured to measure a temperature of said power supply and a safety device coupled to said heat sensor so that the safety device changes state in response to temperature. Examples of a suitable safety device include a light that illuminates when said temperature crosses a threshold and those in which the safety device comprises a lock that prevents access to said power supply when the temperature is higher than a threshold.

As a result of avoiding an active cooling system, an apparatus as described herein achieves numerous advantages. Among these are a reduction in power consumption and an increase in reliability.

In some embodiments, vents at opposing faces of the housing permit air to flow through the housing in much the same way that open windows of a house permit a breeze to flow through the house. In such embodiments, it is typical to have only two such vents, one on each end, to promote such passive ventilation. In particular, it is useful to avoid having additional vents in the remaining two walls since such vents would have the effect of disrupting the airflow through the housing.

Other embodiments feature an additional housing that encloses a power consumer in a data center. In such embodiments, the housing of the power supply is in thermal communication with said additional housing, thereby effectively turning the additional housing into part of the thermal network.

Among these embodiments are those in which the power supply is placed inside an enclosure of a server, such as an enclosure that has the common pizza-box form factor. Such enclosures typically have a fan that is used to cool the components of the server itself. This fan creates an airstream that moves through the enclosure between first and second ends thereof.

In these embodiments, it is useful to place the power supply in the stream of moving air provided by that fan in such a way that the two vents define a line that is essentially parallel to the velocity vector of the air being moved by the fan.

In other embodiments, the power supply is mounted on a rack. In a typical rack, there exists a fan tray that provides convective cooling for all components of the rack. In some embodiments, the fan tray causes air to move horizontally, in which case an airstream similar to that discussed in connection with the power supply that is within an enclosure. In other embodiments, the fan tray causes air to move vertically. In such cases, air that moves transversely along a face that includes a vent creates a low-pressure zone as a result of its movement. The resulting low pressure draws air in through the vent that is on the opposite face, thus providing a cooling airflow within the housing. In either case, it is best to avoid having vents in any other faces since such vents have a tendency to disrupt the airstream within the housing.

The power supply is usable for supplying power to a variety of power consumers in a variety of environments. These include power consumers that are located in data-center rooms that use rack-level power architecture, power consumers that are located in data-center rooms that use board-level architecture, and power consumers that are located in data-center rooms use board-level architecture but that will prospectively be converted into data-center rooms that use rack-level power architecture, as well as stand-alone servers that are either in a data-center room or outside a data-center room. Such stand-alone servers include those that are used by a small business, those that include power supplies in tandem in an enclosure, and those stand-alone servers that rely on board-level power architecture.

In some embodiments, the power supply is placed inside an enclosure or housing of a stand-alone server, in some cases in tandem with at least one additional power supply of the same type.

Embodiments further include those in which the thermal network comprises a polymer-filled tank having walls in contact with the housing the power-handling circuitry comprises a component immersed in the tank. Among these are embodiments in which the component immersed in the tank is a transformer.

In some embodiments, a thermally-conductive polymer is filled between at least part of the outer side wall of the power-handling unit and the side surface of the printed-circuit board so that the power-handling unit is in thermal communication with the housing through the thermally-conductive polymer.

In some embodiments, the power supply is used in a data center room that comprises plural equipment racks in which various types of IT equipment have been mounted and those in which various types of power consumers have been mounted. Each such rack comprise one or more layers of power supplies. Such a configuration is referred to herein as "rack-level power architecture." The various power consumers all have their own housings or enclosures. These power consumers comprise one or more of servers, switchers, switches, routers, information-processing equipment, and information-processing devices. The housings or enclosures of the aforementioned power consumers lack a power supply therein.

It is understood that all materials have some non-zero thermal conductivity and therefore all materials are thermal conductors to some extent. However, it is also true that all materials have some non-zero thermal resistance, which would mean that all materials are also insulators to some extent. In recognition of this logical difficulty, the term "heat-conductive medium" and cognates and variants therefore shall be construed to cover only those materials that the ordinary artisan would have regarded as being thermal conductors and therefore does not include all materials that have non-zero thermal conductivity.

It is also understood that all electrical components handle power to some extent since power is simply the product of voltage and current. However, this does not mean that all components are regarded by the skilled artisan as power-handling components. As used herein, "power-handling circuitry," "power units," and similar terms exclude components that handle power but that would not be regarded by the ordinary artisan as being "power-handling components" or "power units."

As a result of avoiding an active cooling system, an apparatus as described herein achieves numerous advantages. Among these are a reduction in power consumption and an increase in reliability.

Among the power supplies as described herein are those that output significant amounts of power, such as those that output in excess of five hundred watts, those that output in excess of three kilowatts, those that provided sustained power outputs of four thousand watts, and those that provide sustained power outputs of five thousand watts. While those with limited technical understanding of power engineering may believe that the wattage of a power supply is a mere design choice, in fact, there exist significant structural differences between power supplies with low output power and the power supplies described herein.

As used herein, "thermal communication" is intended to refer to heat transfer by conduction through a solid. Thus, two bodies are said to be in thermal communication if heat transfer takes place by conduction, as distinct from convection and radiation.

As a result, two bodies are not necessarily in "thermal communication" simply because thermal energy moves between them. For example, given the meaning of "thermal communication" as used herein, it would be incorrect to say that the Earth and the Sun are in "thermal communication" even though energy that includes wavelengths commonly regarded as "thermal energy" is transmitted through space. This is because such heat transfer is not via conduction through solid.

It should be understood that the above description is only an overview of the technical solution of the present utility model, so that the technical means of the present utility model can be understood more clearly, so that it can be implemented in accordance with the content of the specification. In order to make the above and other objectives, features, and advantages of the present utility model more obvious and understandable, the following examples illustrate the specific implementation of the present utility model.

DESCRIPTION OF DRAWINGS

These and other features of the invention will be apparent from the following detailed description and the accompanying figures, in which.

Within the drawings, the same or corresponding reference numerals indicate the same or corresponding parts.

DETAILED DESCRIPTION

Figure 1:
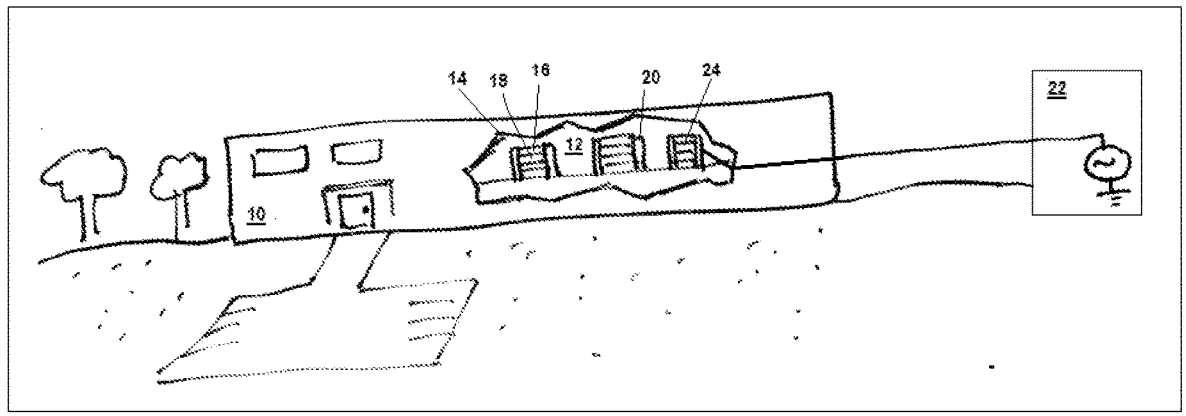
FIG. 1 shows a data center having power consumers that are supplied by power from the power supply.

FIG. 1 shows an internet data center 10 having a data room 12 that holds IT equipment. The IT equipment comprises power consumers 14, such as servers 16 and routers 18. These are often mounted on racks 20.

The data center 10 receives ac power transmitted from a utility 22. This ac power is generally unsuited to operating the power consumers 14 and must be converted into suitable dc power. To carry out this function, it is useful to have one or more power supplies 24, each of which converts ac power into suitable dc power. Such power supplies 24 are often referred to as "ac/dc converters."

The process of converting ac power into dc power is not entirely efficient. As a result, a power supply 24 generates waste heat.

The power supply 24 described herein implements a passive thermoregulation system to dissipate waste heat passively, without an active cooling mechanism that relies on movement of fluid. As a result, there is no need for a fan, in the case in which the fluid is gas, or a pump, in the case in which the fluid is liquid. Such passive thermoregulation avoids the increased cost, reduced reliability, and operating noise of power supplies that rely on active cooling.

Figure 2:
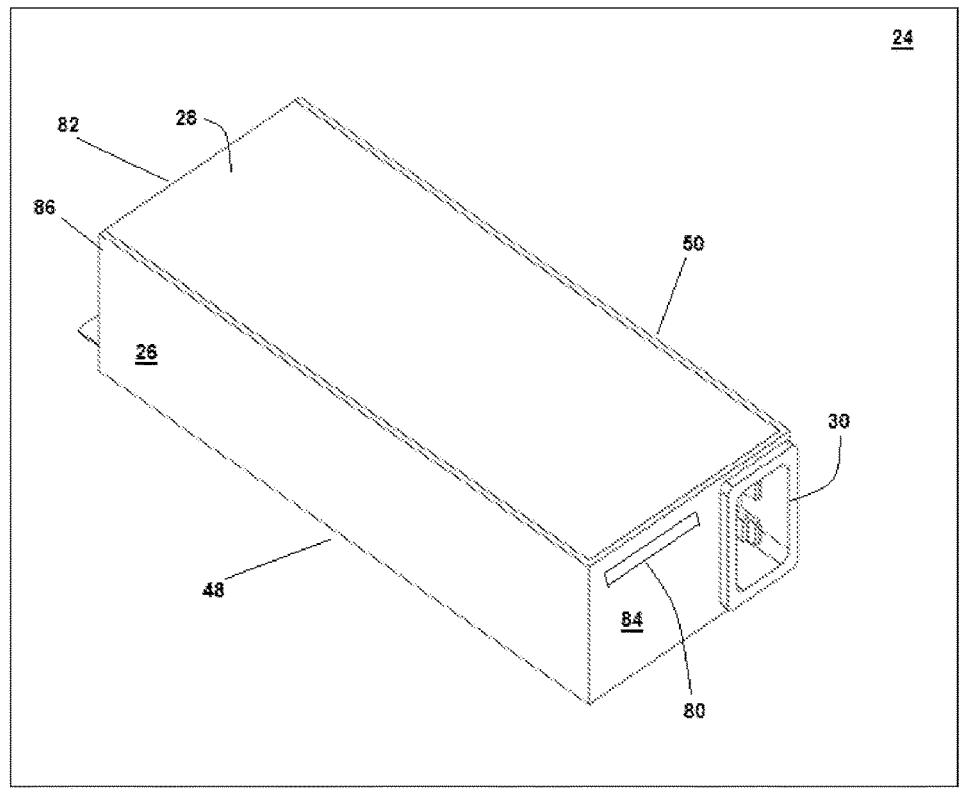
FIG. 2 is an isometric view of a power supply for powering the power consumers shown in FIG. 1.

As shown in FIG. 2, the power supply 24 comprises a housing 26 having faces 28 made of a thermally-conductive material. In typical embodiment, the material is one having high thermal conductivity and high emissivity. A useful material is a metal. Because of its low cost and high emissivity, aluminum is a particularly useful metal. Anodizing the aluminum further improves its emissivity.

In some embodiments, the foregoing material is the first material of a set of materials that includes a second material. The second has a thermal conductivity higher than that of the first material. This can be carried out either by coating the first material with the second material or by inlaying pieces of second material into the first material. This is useful for rapidly spreading heat across multiple faces 28 of the housing 26. The use of such a second material thus reduces the risk of hot spots on a particular face 38 that may be adjacent to a particularly hot component. Examples of a second material include graphite and copper. Since the second material's function is to increase heat conduction and not radiation, emissivity is not as important as it is in the case of the faces 28.

In the illustrated embodiment, the housing 26 takes the form of a rectangular prism having six faces 28 that are in thermal communication with each other. Each of these faces 28 dissipates heat into the ambient air. Having plural heat-dissipating faces 28 greatly increases the rate at which heat can be dissipated from the power supply 24. In addition, having plural heat-dissipating faces 28 also provides greater flexibility in the construction of thermally-conductive pathways between internal heat-generating components and the faces 28.

In the illustrated embodiment, the housing 26 takes the form of a rectangular prism having six faces 28 that are in thermal communication with each other. The six faces 28 include two opposing faces, namely a first end 84 and a second end 86. A first end 84 of the housing 26 includes a socket 30 for receiving the input ac power.

The first and second ends 84, 86 also feature corresponding first and second vents 80, 82. The first and second vents 80, 82 permit air flow through the housing in much the same way that windows in a house passively allow air to flow through the house. Preferably, the vents 80, 82 are made only on opposite faces of the housing 26 such that a path between the openings is parallel to the direction of expected air flow within the data room 12 in the vicinity of the power supply 24. A first end 84 of the housing 26 includes a socket 30 for receiving the input ac power. Vents located on the other faces 28 of the housing 26 would be likely to disrupt this air flow and thus impair cooling efficiency.

The existence of the first and second vents 80, 82 makes it possible for the power supply 24 to exploit sources of moving air that may already be present in the environment. For example, many power consumers 14, such as servers, already include a fan to cool the components of that power consumer 14. The power supply 24, with its vents 80, 82, is configured to exploit this fan. Similarly, many racks 20 have fan trays that move air vertically along the rack 20. In either case, by suitably orienting the vents 80, 82, it is possible to use the kinetic energy of that moving air to draw air through the housing 26.

Figure 3:
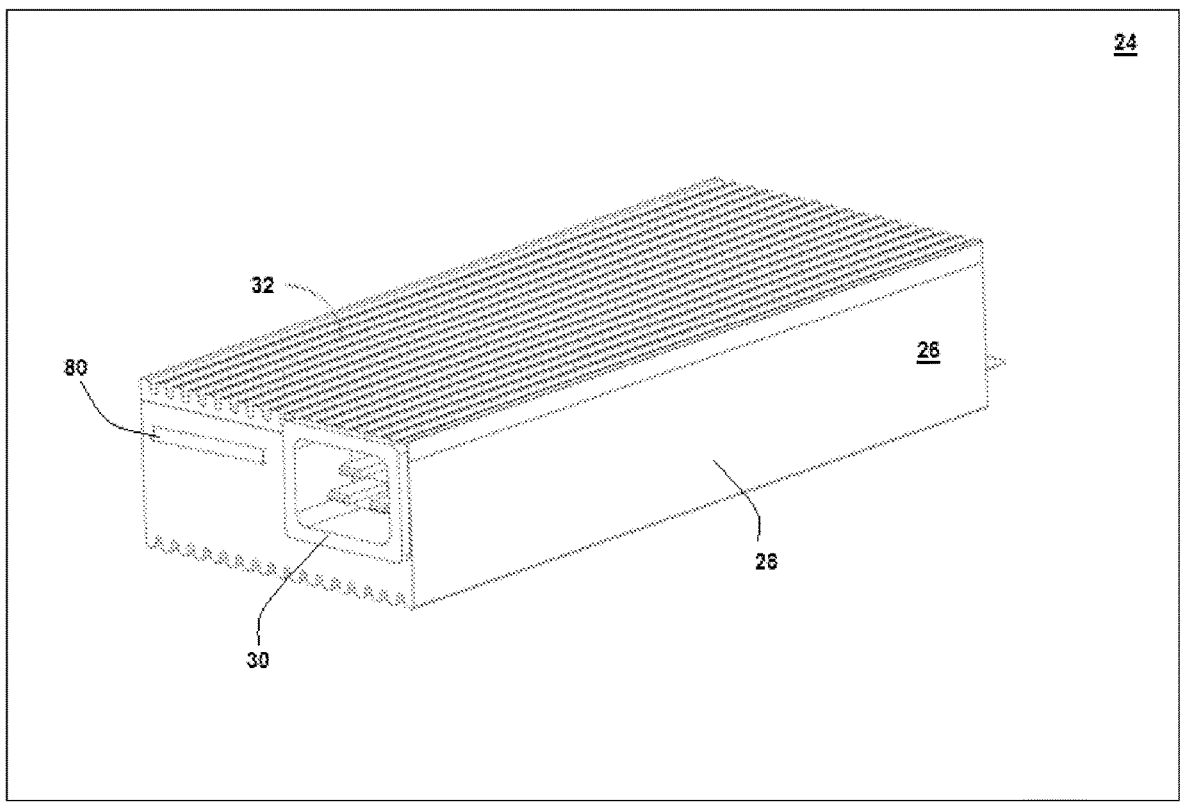
FIG. 3 shows a power supply similar to that shown in FIG. 2 but with fins on a face thereof.

FIG. 3 shows a power supply 24 similar to that shown in FIG. 2 but with the addition of fins 32 on a face 28 thereof. Embodiments include those in which fins 32 are placed on any or all faces 28 except those faces 28 or portions thereof in which the presence of fins 32 would impede the performance of another function, such as in or around the socket 30 or in an installation area. These fins 32 promote heat dissipation.

There exist two ways to supply power to a power consumer 14 such as a server. The first way is to place the power supply 26 inside the server's enclosure, or housing. The second way is to place the power supply outside the server's enclosure.

The first way, which is to place the power supply 24 inside the server's enclosure, results in a stand-alone power consumer 14, such as a stand-alone server. The server's own circuitry, such as its processor and memory, are thus in the same enclosure as the power supply 24. This configuration is discussed in connection with FIGS. 4 and 5.

The second way typically involves placing power supplies 24 and power consumers 14, such as servers on racks 20, and connecting them. In this method, the power supply 24 is separate from the power consumer 14 (i.e., the server, router, or switch that it is power). An example of this configuration is shown in FIG. 7.

Figure 4:
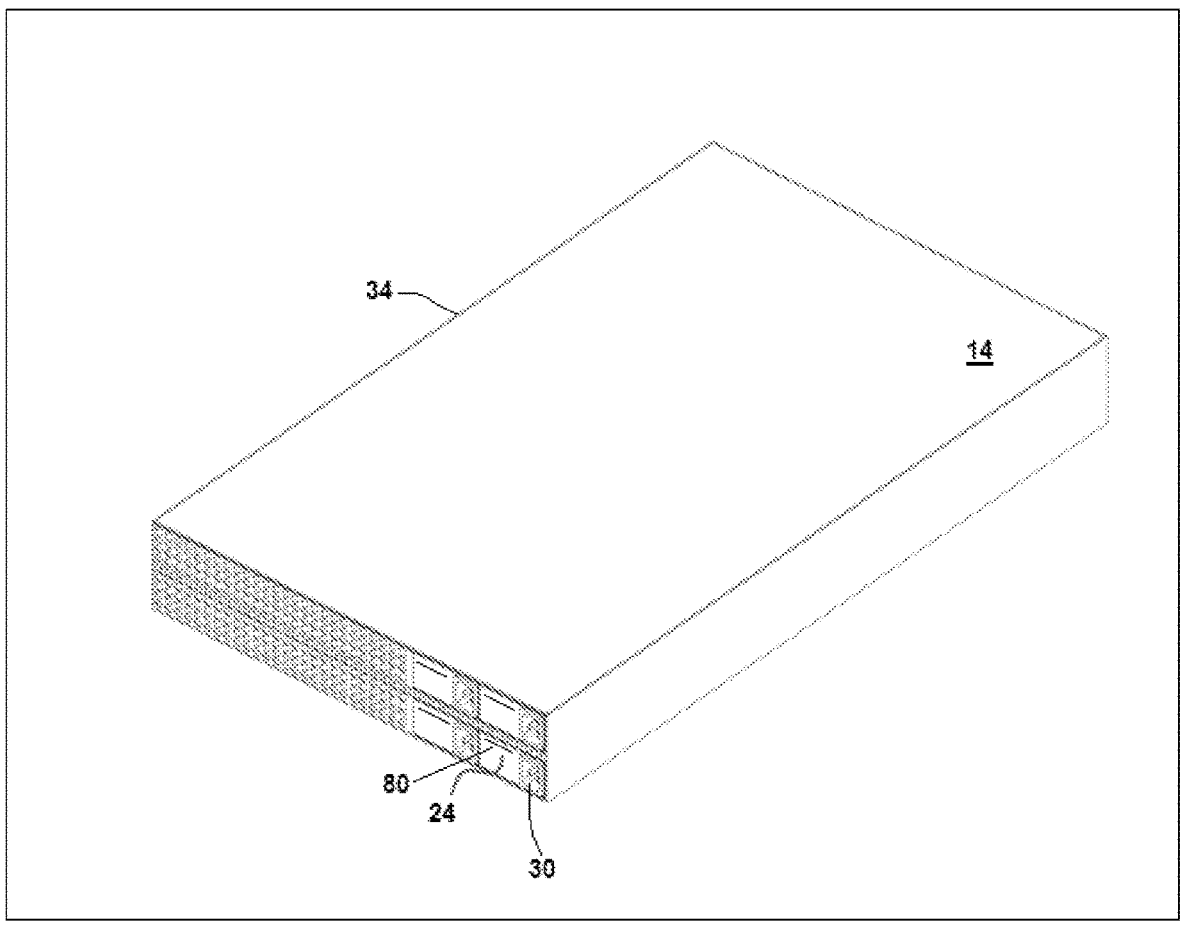
FIG. 4 shows two stacked enclosures in the pizza-box format, each of which includes a server from the data center of FIG. 1 together with a pair of power supplies.
Figure 5:
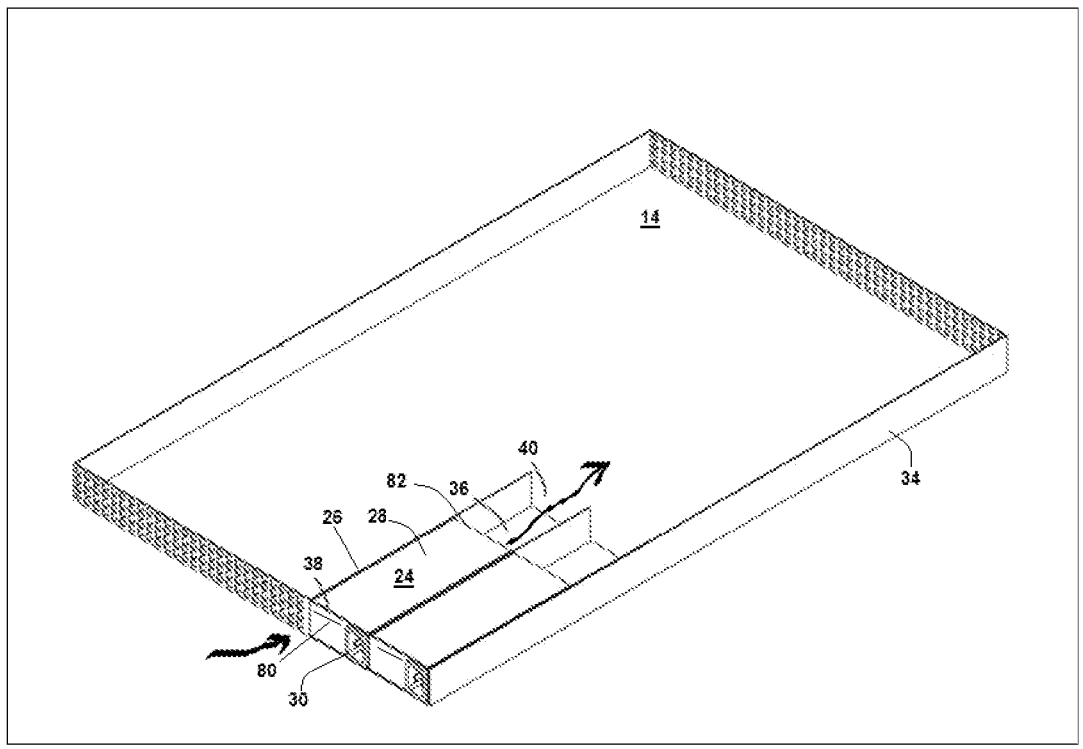
FIG. 5 shows one of the enclosures from FIG. 4 with a wall having been removed to reveal two instances of the power supply of FIG. 2.
Figure 7:
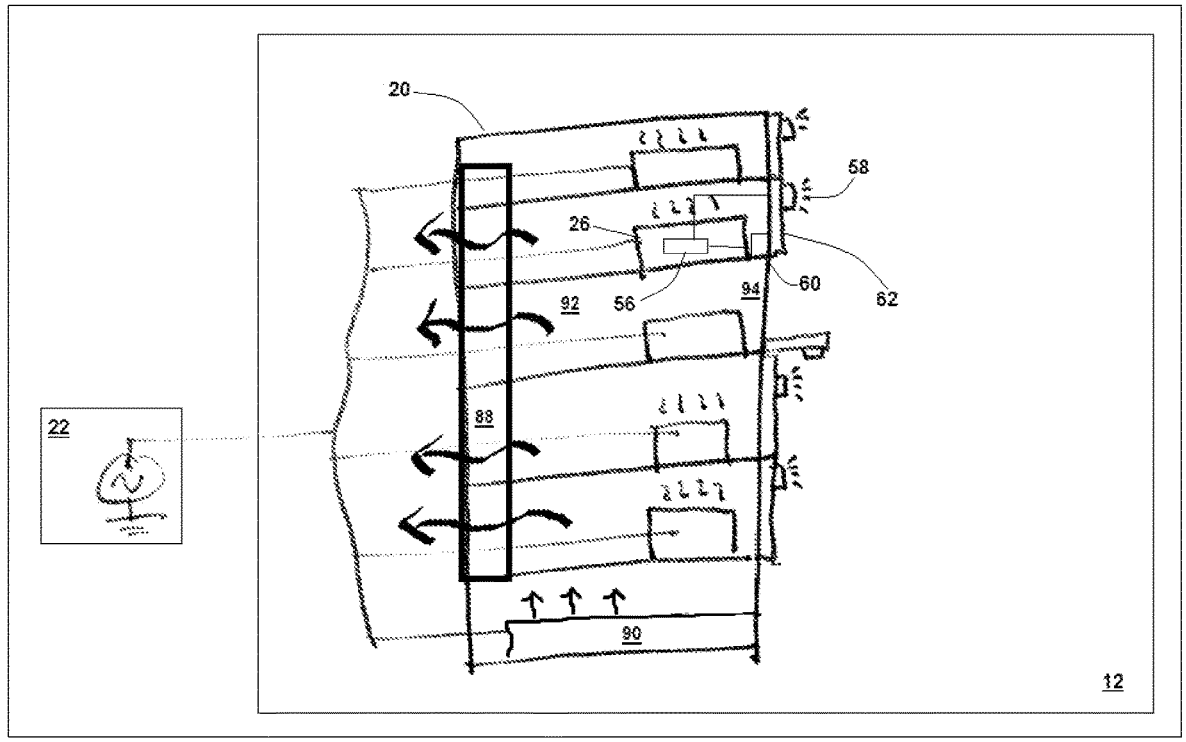
FIG. 7 shows a rack in a data center on which multiple power supplies of the type shown in FIG. 2 have been mounted and also showing safety equipment to suppress the risk of inadvertent contact with a hot power supply.

The illustrated power supply, and the principles by which it operates, is applicable to both the stand-alone server configuration of FIGS. 4 and 5 and to the rack-mounted configuration of FIG. 7.

In some cases, the power supply 24 is one of a pair of identical power supplies that are disposed within an enclosure 34 of a power consumer 14, as shown in FIG. 4. The power consumer's enclosure 34 shown is one that uses the "pizza-box" form factor. Such a form factor is particularly useful for stacking power consumers 14 on racks 20 in a data center 10. FIG. 4 shows two such power consumers 14 that have been so stacked. Each power consumer 14 has a pair of power supplies 24.

The power supplies 24 operate in tandem to provide power to the power consumer 14. It is possible for the power consumer 14 to operate for a limited period should one of the power supplies 24. However, the failed power supply 24 should be replaced promptly. Typically, in the event of failure, an alarm is sent to a human operator who then swaps out the failed power supply 24 and replaces it with a new one. For this reason, the power supplies 24 are made to be hot-swappable.

FIG. 5 shows one of the power consumers 14 of FIG. 4 with the top of the enclosure 34 having been removed to reveal the two power supplies 24. Each power supply 24 has been inserted into a corresponding cavity 36 formed inside the power consumer's enclosure 34. The cavity 36 comprises cavity walls that are in thermal communication with the walls of the enclosure 34 and also with the faces 28 of the power supply 24. This permits conduction of heat generated within the power supply 24 to the walls of the enclosure 34 for eventual dissipation in the environment of the data room 12. As a result, the enclosure 34 in effect becomes part of the passive heat dissipation system.

The power supply 24 has multiple faces 28. Each of these faces 28 can be used for dissipation of heat. The ability to use more than one face 28 to dissipate heat greatly increases the rate at which heat can be dissipated from the power supply 24.

In some embodiments, the thermal communication between the walls of the cavity 36 and faces 28 of the power supply's housing 26 arises as a result of a flexible and thermally conductive medium that fills at least some of the gaps between the walls of the cavity 36 and faces 28 of the power supply's housing 26. Examples of a suitable material include a heat-conducting oily substance and a heat-conducting sponge. This promotes heat conduction even in the presence of irregular surfaces since the medium fills any gaps formed by such irregularities.

The power supply 24 is inserted into the cavity 36 through an external opening 38 and plugged into the power consumer 14. The power supply's socket 30 is exposed to receive ac power from the utility 22.

In some embodiments, the cavity 36 also includes an internal opening 40 that opens into the interior of the enclosure 34. As a result, there exists a fluid pathway between the internal opening 40 and external opening 38 through which moving air can carry away some heat by convection. In some embodiments, movement arises naturally as a result of air being expanded by heat. In others, there exists a fan within the enclosure 34. The moving air generated by this fan cools the components of the power consumer 14. However, as noted below, the power supply 24 can also take advantage of the fan's operation.

The power supply 24 is disposed to intercept the moving air along this fluid pathway. In particular, air that moves towards the external opening 38 is drawn into the first vent 80 of the power supply's housing 26. This air continues through the power supply's housing 26 and exits through the second vent 82 of the power supply's housing 26. This allows the power supply 24 to take advantage of the moving air provided by the fan that is already within the enclosure.

The fact that the power supply 24 takes advantage of an existing fan does not change the fact that the power supply 24 itself does not have a constituent fan or that it carries out active cooling.

By way of analogy, a human being who sits in front of an electric fan to cool off would not be said to have an internal organ that corresponds to a fan. Such a human being would be cooling himself passively.

The fact that a power supply 24 cools passively does not preclude the possibility of the power supply 24 taking advantage of features in its environment in order to do so. A passively-cooled power supply 24 is certainly permitted to take advantage of the benefit of moving air to dissipate heat for the same reason that a human can do the same. It makes no difference whether the moving air moves as a result of a fan or other mechanical contrivance or whether it moves as a result of denser air sinking downwards and displacing more rarefied air. The physical principles are the same.

In other cases, the power supply 24 is mounted directly on a rack 20. This configuration is referred to as rack-level power architecture. In such cases, the rack 20, which is typically a metal structure, is in thermal communication with one or more faces 28 of the housing 26 either directly or through a similar flexible and thermally conductive material. As a result, the rack 20 effectively becomes part of the power supply's passive thermoregulation system.

Figure 6:
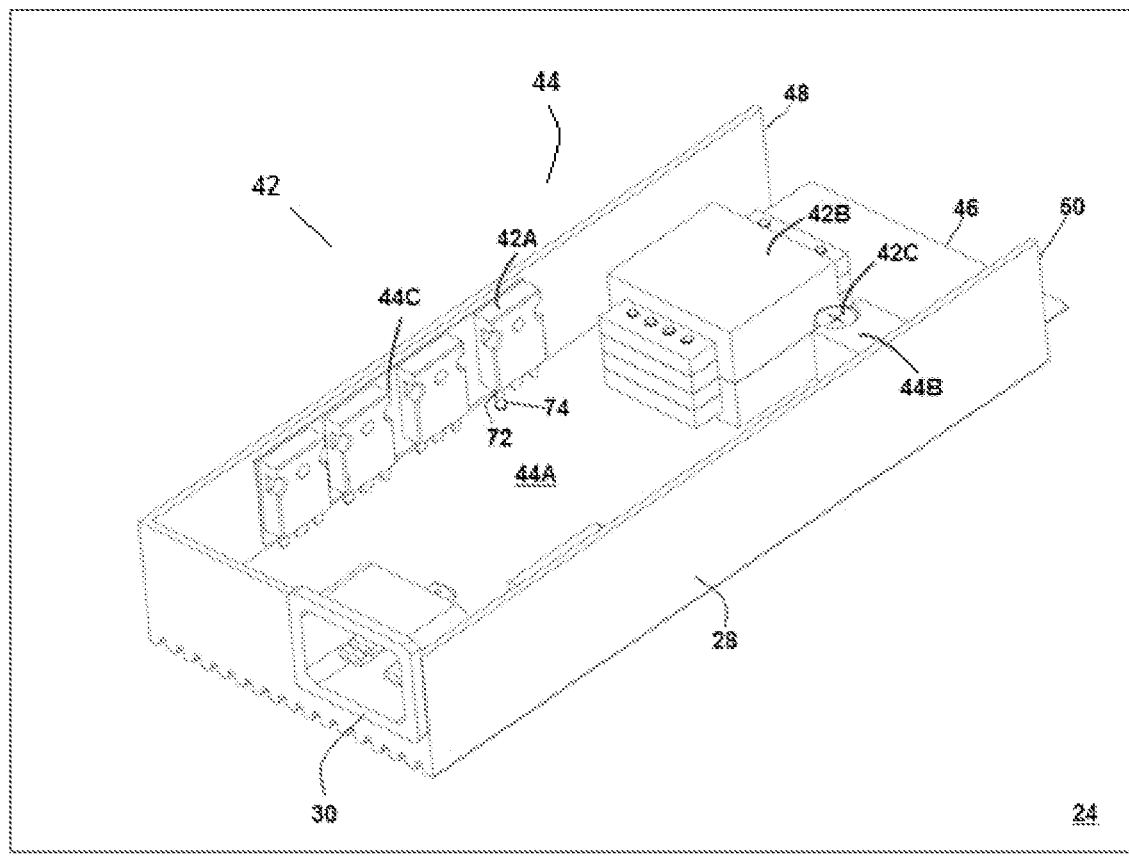
FIG. 6 shows the power supply of FIG. 2 with faces having been removed to show typical components of a thermal network and power-handling circuitry.

To reveal the manner in which passive heat dissipation is promoted within the power supply 24, FIG. 6 shows the power supply 24 of FIG. 2 with certain faces 28 having been removed from the housing 26. Among the faces 28 that remain in FIG. 6 are a floor 46, a first sidewall 48, and a second sidewall 50 opposite the first sidewall 48.

As shown in FIG. 6, the power supply 24 comprises power-handling circuitry 42. The power-handling circuitry 42 comprises power-handling units that, in the course of participating in providing power to the power consumer 14, generate waste heat. Examples of power-handling units include a power semiconductor device 42A, a transformer 42B, and an electrolytic capacitor 42C.

Also shown in FIG. 6 is a thermal network 44.

The thermal network 44 is a passive solid-state network that provides solid state paths of high thermal conductivity between components of the power-handling circuitry 42 and the faces 28 of the housing. In many cases, the thermal network 44 provides a solid-state thermal path between a component and two or more faces 28 of the housing so as to minimize the magnitude of the temperature-gradient vector on the faces 28. As a result, during steady-state operation, the faces 28 are all at the same temperature, with essentially no hot spots being detectable.

Conceptually, the thermal network 44 can be viewed as defining a thermal circuit that coexists with the power-handling circuitry 42. Just as the power-handling circuitry 42 provides electrically-conductive paths between points at different voltages so that electric current can flow therebetween, the thermal network 44 provides thermally-conductive paths between points at different temperatures so that heat energy can flow therebetween.

It is true that, due to the second law of thermodynamics, heat generated by the power-handling circuitry 42 will eventually find its way to the faces 28 of the housing 26. However, the second law has nothing to say about the rate at which this occurs. By providing a thermal network 44 of solid-state conducting paths between heat sources within the power-handling circuitry 42 and the housing's faces 28, it is possible to conduct heat energy rapidly and in copious quantities from the heat sources to multiple faces 28 of the housing 26. In particular, it is possible to do so at a rate that matches the rate at which the power-handling circuitry 42 generates heat. As a result, the thermal network 44 makes it possible for the power-handling circuitry 42 to engage in sustained operation at a suitable operating temperature.

The power-handling circuitry 42 comprises various kinds of power-handling units, each of which generates heat as a waste product. Examples of the different kinds of power-handling units include a power semiconductor device 42A, a transformer 42B, and a capacitor 42C. A particularly useful type of capacitor 42C, because of its ability to store considerable charge even in a small area, is an electrolytic capacitor.

An electrical circuit has components of various impedances that relate the driving force, namely a voltage difference, to something that flows, namely electric current. The thermal network 44 likewise has components, referred to herein as "thermal resistors," that have thermal resistances. These thermal resistances likewise relate a driving force, namely a temperature difference, to something that flows, namely heat energy.

The thermal network 44 comprises thermal resistors having low thermal resistances. The thermal resistors connect the faces 28 of the housing 26 to the various power-handling units of the power-handling circuitry 42 so as to form a network of solid-state heat-transfer paths that conduct heat energy generated by the power-handling circuitry 42 to the housing's faces 28 for eventual dissipation into the environment of the data center 10. Some thermal resistors connect directly to a face 28. Others connect indirectly to the face 16 via another thermal resistors. Examples of thermal resistors having low thermal resistance include a printed-circuit board 44A, a projection 44B, 44D, a thermally-conductive medium 44C, examples of which can be seen in FIG. 2. Another example is an electromagnetic-interference shield 44E, which can be seen in FIG. 3. Yet another example is an inlaid thermally conducting strip 44F, which can be seen in FIG. 15.

Passive heat dissipation is carried out by using the thermal network 44 to conduct heat generated by the power-handling circuitry 42 to the faces 28 of the housing 24 rapidly enough so that the equilibrium temperature of the power-handling circuitry 42 remains within a specified range during normal operation of the power supply 24. This is achieved by strategic placement of the various power-handling units relative to thermal resistors of the thermal network 44.

Each power-handling unit is ultimately in thermal communication with one or more faces 28 of the housing 26 through one or more of the thermal resistors. Some are in thermal communication with two or more faces 28. However, the power-handling units remain electrically isolated from the housing 14 and from each other. As a result, the power-handling units avoid causing conduction current on the faces 28 of the housing 26.

An advantage of having plural faces 28 all cooperating to dissipate heat into the ambient air is that there are more choices when designing a thermal network 44 to move the heat. Instead of having all power-handling circuitry 42 be in thermal communication with the same face 28, it becomes possible to connect different power-handling units to different faces 28. It also becomes possible to connect a power-handling unit to two or more faces 28. In effect, the ability to use all faces 28 of the housing 14 creates what amounts to an omnidirectional heat sink that transfers thermal energy directly into the ambient environment, such as the ambient air or to a metal rack. The housing 26 is thus a biomimetic structure that carries out heat dissipation in a manner similar to that adopted by many warm-blooded animals, in which the entire surface of the skin is available for dissipation of internally-generated heat without the need for an active heat-dissipating organ that would be analogous to a fan.

In FIG. 6, all faces 28, including those concealed or omitted, are available for receiving heat energy from the power-handling circuitry 42. In effect, the entire housing 26 is available for use in connection with dissipating heat. This is different from a conventional circuit having a heat sink. In effect, the structure shown in FIG. 2 defines a heat sink that completely encloses the power-handling circuitry 42 thereby cutting it off from any cooling air. The conventional wisdom is such that a circuit enclosed in this way would quickly overheat. However, by careful design of a thermal network to connect the power-handling circuitry 42 to the housing 26, it has been found possible to create thermal superhighways that convey heat to the housing's walls so that it can be dissipated as fast as it is produced. This results in a power supply in which the power-handling circuitry 42 is effectively sealed from the outside environment and yet manages to avoid overheating.

In the power supply 24 shown, no active heat-dissipation is required. Unlike conventional power supplies, the illustrated power supply 24 mimics the manner in which heat dissipation is carried out by human beings, namely by conducting metabolically-generated heat to a surface, i.e., the skin, that is exposed to the environment. In the power supply 24, the thermal network 44 draws internally-generated heat to what amounts to the power supply's skin, namely the union of all the faces 28 that form the power supply's housing 26. This permits heat dissipation into the environment, which is ultimately the data room 12 in the data center 10.

It should be noted that this mimicry is not entirely complete. In a human being, heat conduction to the skin is facilitated by blood that flows along tubes that are close to the skin's surface. In the illustrated power supply 12, no liquids are necessary. The process of heat transfer is carried out entirely in the solid state. Instead of relying on convection by fluid, whether it be gas or liquid, heat transfer via the thermal network 44 is mediated by the same valence electrons that are normally used to conduct electricity or, in the case of non-electrically conductive media, through phonons propagating through the material's crystalline structure.

By having eliminated the fan, the illustrated power supply 24 significantly reduces power consumption and operating noise relative to that of comparable power supplies that rely on having a fan for cooling during normal operation. Moreover, since the fan is among the first components to fail, the power supply's operating lifetime and reliability are significantly greater than those of a comparable power supply that relies on a fan.

The foregoing advantages exist in connection with having eliminated forms of active cooling as well, such as liquid cooling systems. Active cooling systems in generally require a pump, fan, or other mechanical contrivance that is ultimately subject to wear and failure and that ultimately adds cost.

The power supply 24 features a passive thermo-regulation system in which thermally-conductive pathways formed by a thermal network 44 provide thermally-conductive paths that connect heat-generating components of a power-handling circuitry 42 to the faces 28 of the housing 26. These paths are solid-state paths, thus eliminating the disadvantages of relying on liquid for heat transfer. The faces 26 collect this heat energy and dissipate it by a combination of convection, radiation, and conduction. The passive thermo-regulation system thus promotes the power supply's ability to achieve thermal homeostasis without the use of moving parts, such as fans.

The power supply 12 also indirectly dissipates heat by convection because the housing 26 is exposed to ambient air. As the thermal network 44 brings heat energy to the housing's faces 28, the elevated temperature of the faces 28 heats nearby air, thus expanding it and causing convection.

The foregoing power supply 24 is usable for providing power to a variety of power consumers 14 that would be found in a typical internet data center 10. Such power consumers 14 include servers 16 and routers 18.

The power supply 24 dissipates heat by convection because the housing 26 is exposed to ambient air. As the thermal network 44 brings heat energy to the housing's faces 28, the elevated temperature of the faces 28 heats nearby air, thus expanding it and causing convection.

In some cases, nearby fans or ventilation sources promote the aforementioned convection mechanism by blowing air past the housing 26. In such cases, the power supply's ability to dissipate by convection benefits from such air movement in much the same way that a human's ability to dissipated metabolically-generated heat benefits from exposure to a cooling breeze. However, just as the source of a cooling breeze is separate and apart from the person who benefits from it, so too is the source of additional convection in the data room 12 separate and apart from the power supply 24.

The power supply 24 dissipates heat by radiation because the housing's faces 28, being at an elevated temperature, radiate electromagnetic waves in a manner analogous to a blackbody radiator. This mode of heat dissipation is carried out independently of convection and in fact occurs even in a vacuum.

The power supply 24 also dissipates heat by conduction because the housing's faces 28 are in thermal communication with another thermally-conductive structure that serves as a heat sink. In some embodiments, as shown in FIG. 5, the power consumer 14 is housed within an enclosure 34 and the power supply 24 is in thermal communication with that enclosure 34. As a result, the enclosure 34 acts as a heat sink.

In the case of rack-level power architecture, in which the power supply 24 is mounted on a rack 20. In such cases, the rack 20 acts as a heat sink that accepts heat energy from the power supply's faces 28.

The housing's ability to rapidly dissipate heat arises in part from the use of more than one of its faces 28 for heat dissipation. In the case of the illustrated housing 26, which takes the form of a rectangular prism, all six faces 28 are used for heat dissipation.

Moreover, in an effort to promote more rapid conduction throughout the housing 26, thus promoting a more even spatial distribution of heat, it is useful to thicken the housing's faces 28 relative to those that are used in comparable power supplies that rely on a fan. This also serves the function of increasing the amount of heat energy that would be required to raise the temperature of the housing's faces 28.

In a preferred embodiment, the thickness of the housing's faces 28 is greater than one millimeter. Among these are embodiments in which the thickness is three millimeters. The additional thickness also makes it possible to counter-sink screws holding the housing 26 together. This promotes greater surface contact and thus further promotes heat conduction to the walls.

As a result of having received heat energy from the power-handling circuitry 42, the power supply's faces 28 are apt to be hot enough to inflict pain on human flesh. To reduce the possibility of injury to service personnel, it is useful to provide a heat sensor 56 that is in thermal communication with the housing 26, as shown in FIG. 7. The heat sensor 56 triggers a warning light 58 to warn service personnel not to touch the power supply 24.

In other embodiments, it is useful to provide a lock 60 that prevents access to the power supply 24 until it reaches a safe temperature. An example of such a lock 60 is one that operates based on an output of the heat sensor 56. In such a case, the lock 60 locks an access panel 62 when the heat sensor 56 senses a temperature above a threshold. This prevents access to the power supply 24 when the power supply's housing 26 is still at an elevated temperature after having just been turned off for service. The lock 60 unlocks the access panel 62 when the heat sensor 56 senses that the temperature of the power supply's housing 26 has dropped to a safer temperature. This drop to a safer temperature occurs quickly because the power supply 24 has been engineered specifically to shed heat quickly.

As shown in FIG. 7, a first fan tray 88 is disposed to move air through the rack 20 so that air moves through the vents 80, 82, thereby driving a cooling airflow through the housing 26. In a typical embodiment, the direction of airflow through rack 20 creates a hot aisle 92 and a cool aisle 94 on either side of the equipment mounted on the rack 20. A second fan tray 90 drives the hot air in the hot aisle 92 vertically to be vented out of the rack 20 towards a cooler for recirculation.

Referring back to FIG. 6, among the thermal resistors of the thermal network 44 is a printed-circuit board 44A that is disposed near the floor 46 and in thermal communication, either directly or indirectly, with the housing 26. Examples of a printed-circuit board 44A include those made of fiberglass and epoxy laminate, such as FR4, and those with a metal core to promote heat conduction. Other printed-circuit boards are those that incorporate bromine or another halogen and those that are fire resistant.

An outwardly-facing side of the printed-circuit board 44A is in thermal communication with the floor 46, either directly or indirectly. An inwardly-facing side of the printed-circuit board 44A has components of the power-handling circuitry 42 mounted thereon. Examples of such components include power-handling semiconductor integrated circuits, resistors, diodes, transistors, inductors, and capacitors.

Heat generated by these surface-mounted components is transmitted via heat-conducting components of the printed-circuit board 44A directly or indirectly to one or more faces 28 of the housing 26.

Among the foregoing embodiments are those in which the printed-circuit board 44A is a multi-layer printed-circuit board 44A that includes intermediate thermally-conductive layers, such as metal layers. Among these are printed-circuit boards 44A in which the intervening metal layers are as thick as possible. This causes the multi-layer printed-circuit board 44A to more closely approximate a solid metal slab, thus providing a greater ability to absorb more heat energy per unit rise in temperature.

Embodiments include those in which different kinds of power-handling units, such as power integrated circuits 42A, transformers 42B, and capacitors 42C mount to the inwardly-facing side of the printed-circuit board 44A. In some embodiments, a thermally-conductive path between a power-handling unit and the housing 26 extends through an opening in the printed-circuit board 44A to connect that power-handling units with one or more faces 28 of the housing 26.

In the illustrated embodiment, the outwardly-facing side of the printed-circuit board 44A faces the floor 46. However, alternative embodiments include those in which the outwardly-facing side of the printed-circuit board 44A faces the first sidewall 48, those in which it faces the second sidewall 50, and those in which it faces any other face 28, circumference, or periphery of the housing 26 such that heat is transferred by conduction in quantities significant enough to effectively cool the power supply 24 by heat dissipation into the data room 12.

Also among the thermal resistors of the thermal network 44 are regions containing a thermally-conductive medium 44C. Examples of a thermally-conductive medium 44C include a thermally-conductive adhesive, thermally-conductive sponge, or a layer of graphene having perforations therethrough with either thermally-conductive adhesive or thermally-conductive sponge filling the perforations to promote thermal conductivity along the direction transverse to that in which the graphene layer exhibits its maximum thermal conductivity.

It is recognized that all materials have a non-zero thermal conductivity. Accordingly, as used herein, a "thermally-conductive medium" is one that would have been regarded by an ordinary artisan as a thermally-conductive medium.

An example of such a sponge is one made of closed cell silicone that provides both thermal conductivity and electrical isolation. In some embodiments, thermally-conductive medium 44C fills a gap between the printed-circuit board 44A and the floor 46 or between a power-handling unit and either another thermal resistor or the housing. The thermally-conductive medium 44C is particularly useful as a result of its ability to conform to irregular surfaces, thus promoting more efficient heat transfer.

Also among the components of the thermal network 44 is a projection 44B. The projection 44B comprises a thermally-conductive body having an end that is in thermal communication with a face 28 of the housing 26. The body projects inward from the face 28 into the housing's interior, thus providing a thermally-conductive surface to which a power-handling units 42C is mounted. This causes heat to be conducted from that power-handling unit 42C to the housing's face 28.

The projection 44B is not limited to being in thermal communication with only one face 28. In the embodiment shown in FIG. 6, the projection 44B is in thermal communication with both the second sidewall 50 and the floor 46.

To further promote heat transfer, some embodiments of the projection 44B include a recess 68 that conforms to the shape of the power-handling unit 42C. In the illustrated embodiment, the power-handling unit 42C is a cylindrical structure, such as an electrolytic capacitor. As such, the recess 68 is concave and semi-circular. This increases contact area between the power-handling unit 42C and the projection 44B, thus promoting more rapid heat transfer.

Moreover, although the illustrated projection 44B only has one power-handling unit 42C attached to it, the projection 44B is large enough to accommodate more than one power-handling unit. For example, in the illustrated embodiment, it is possible to accommodate additional power-handling units on the sides of the projection 44B.

In the illustrated embodiment, the projection 44B projects along a line. However, embodiments also include those in which the projection 44B follows a meandering path and those in which the projection 44B follows a curved path.

Figure 8:
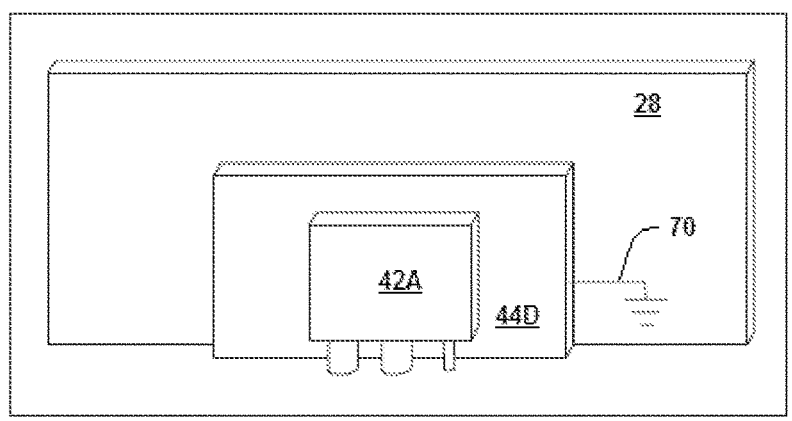
FIG. 8 shows a shield to suppress electromagnetic interference from a power-handling units that are within the housing of the power supply, as shown in FIG. 6.

In some cases, the thermal connections between the housing's faces 28 and the various internal components of the power supply 24 create a heightened risk of electromagnetic interference due to electrical currents on the housing's faces 28. It is therefore useful for the thermal network 44 to include a shield 44D, as shown in FIG. 8. Such a shield 44D is implemented as a conducting enclosure that has a grounding connection 70. Such a shield 44D provides both thermal communication with a face 28 and suppression of electromagnetic interference.

Figure 9:
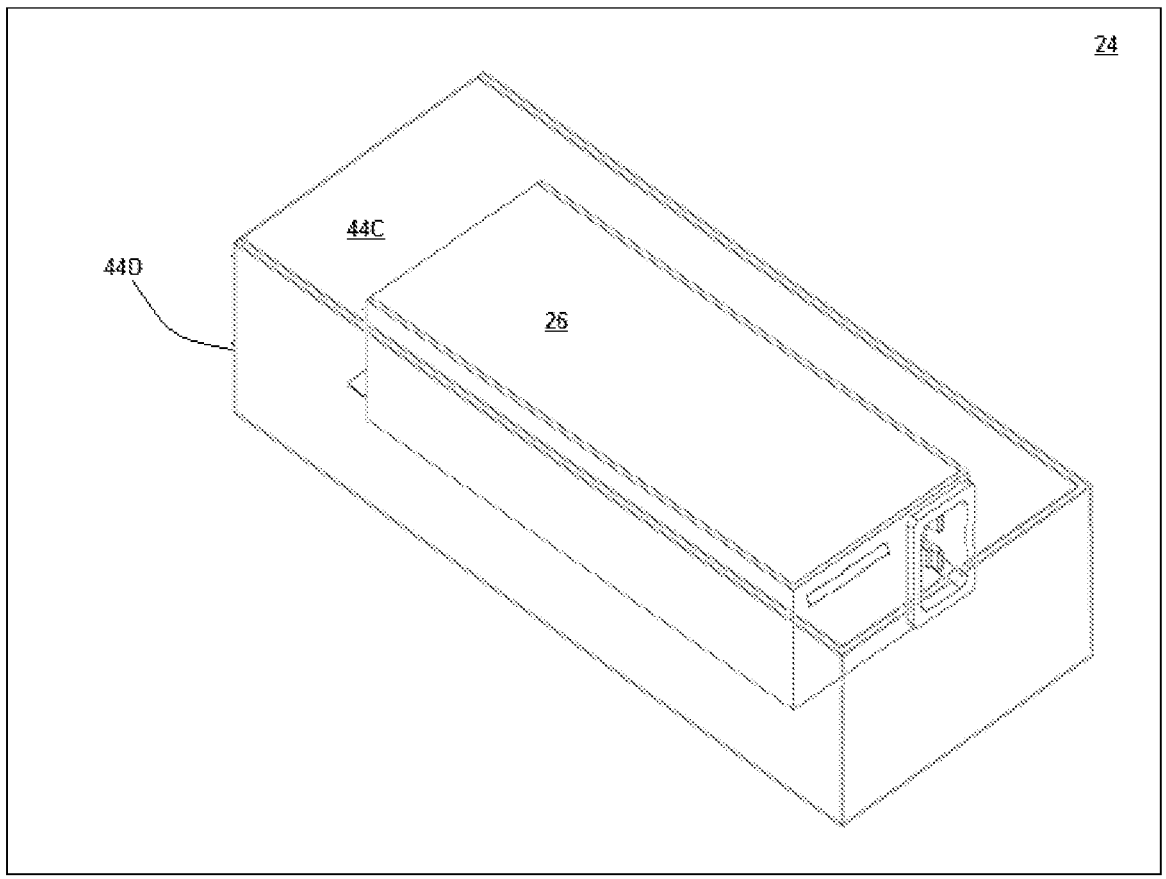
FIG. 9 shows a shield similar to that shown in FIG. 8 but disposed around the housing.

In an alternative embodiment, shown in FIG. 9, the shield 44D is a grounded box or cage that surrounds the entire housing 26. In such a case, an electrically-isolating but thermally-conductive medium 44C fills a gap between the housing 26 and the shield 44D.

FIG. 6 shows a power-handling unit implemented as a through-hole type power semiconductor device 42A that is indirectly connected to the first sidewall 48 by a thermally-conductive medium 44C. The thermally-conductive medium 44C is electrically isolating. As a result, there exists electrical isolation between the power semiconductor device 42A and the first sidewall 48.

To promote more rapid heat dissipation, it is useful to choose the side of the power semiconductor device 42A that adheres to the thermally-conductive medium 44C to be the side having the largest area. The various pins 72 of the power semiconductor device 42A pass are inserted into pin through-holes 74 of the printed-circuit board 44A. Based on this, the heat generated by the second power-handling unit 42A can be transferred to the power supply housing 26 through the second heat transfer medium 44, resulting in efficient heat dissipation.

Figure 10:
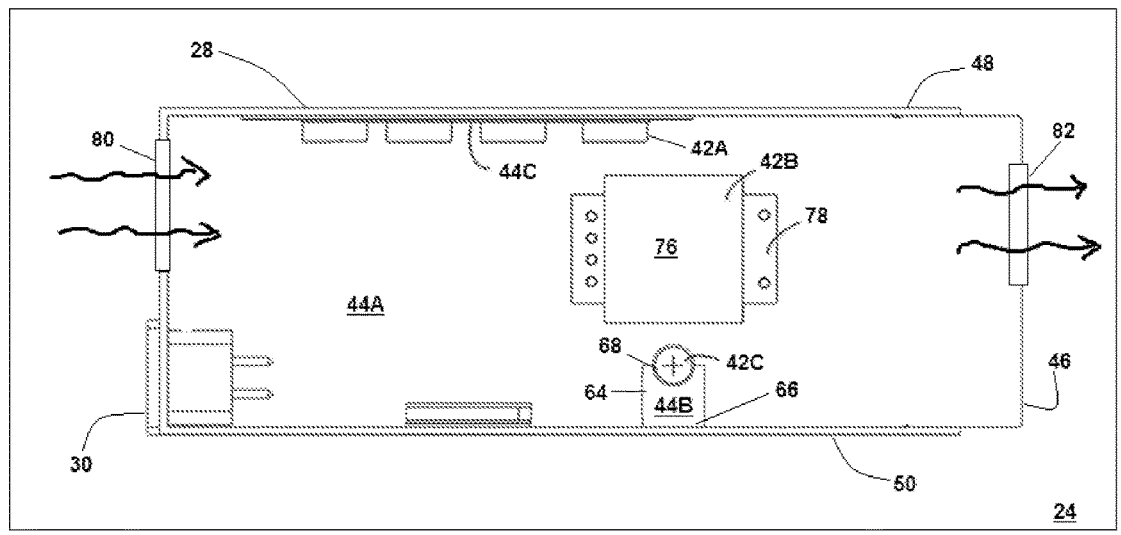
FIG. 10 shows a plan view of circuitry seen in FIG. 6 together with air being passively drawn through vents placed in opposed faces of the housing.

Among the power-handling units shown in FIG. 6 is a transformer 42B that comprises a magnetic core 76 and windings 78, as shown in FIG. 10. Any of the thermal resistors 44A, 44B, 44C, 44D already described are available to dissipate heat from the transformer 42B, either alone or in various combinations. In some embodiments, the windings 78 are soldered onto the printed-circuit board 44A to transmit heat thereto.

Figure 11:
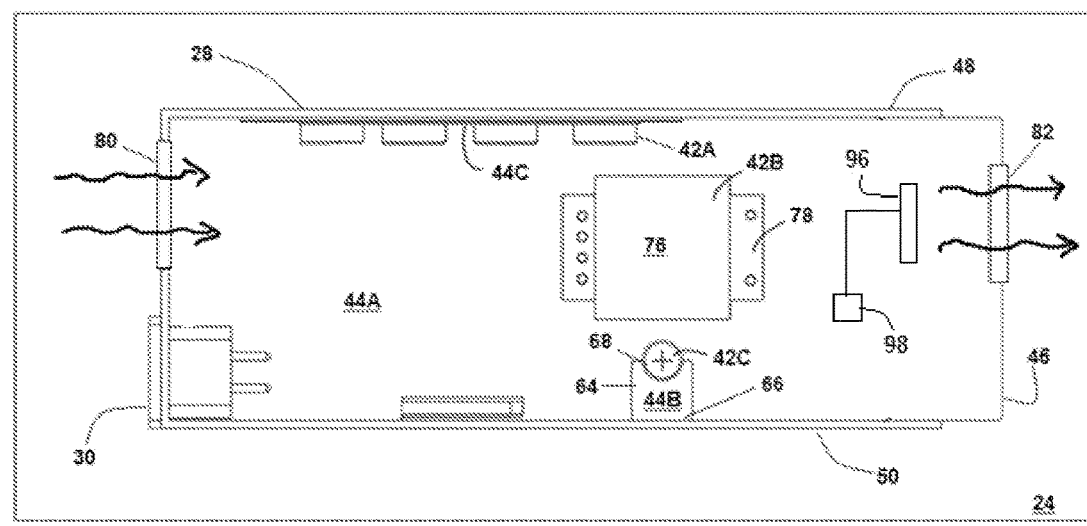
FIG. 11 shows the embodiment of FIG. 9 but with the addition of an emergency fan.

Referring now to FIG. 11, as a failsafe measure, in some cases it is useful to provide an emergency blower 96 having a temperature measurement device, such as a thermocouple 98 that causes the emergency blower 96 to turn on in case, for whatever reason, an unsustainably high temperature is reached. Such an emergency blower 96 would not be expected to ever be activated during the lifetime of a power supply 24. However, it is available in case of emergencies.

Accordingly, the emergency blower 96 plays a role similar to an emergency sprinkler system in an office building. Just as an emergency sprinkler is not activated on a daily basis to cool the inhabitants of the office, so too is the emergency blower 96 not activated on a daily basis to cool the power supply. Just as it is common for a sprinkler system to never be activated during a building's lifetime, it is also common for the emergency blower 96 to never be activated during the power supply's lifetime.

Figure 12:
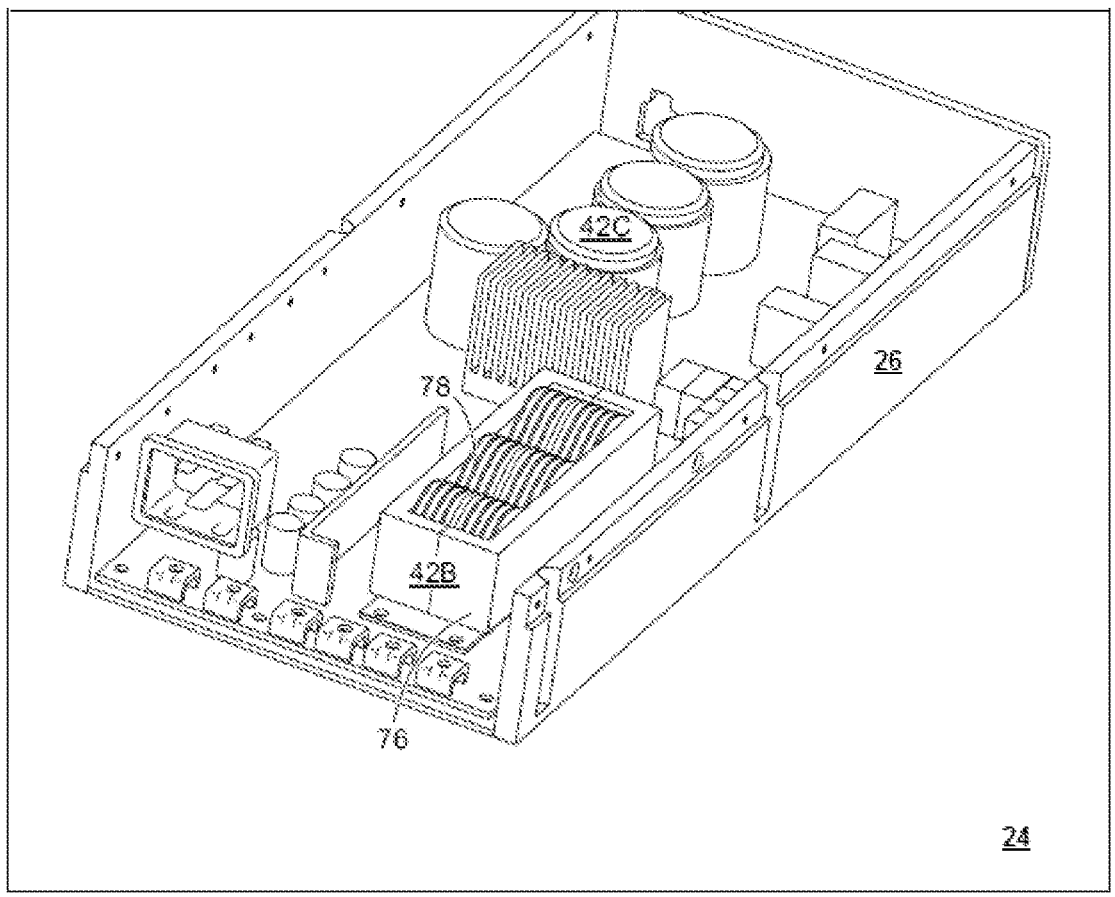
FIG. 12 shows an isometric view of a power supply having a magnetic power-unit in its power train.

As can be seen from FIG. 12, the physical structure of a typical transformer 42B is often not conducive to heat transfer by conduction. The transformer's windings 78, for example, tend to define a curved surface and the core 76 that accommodates the windings 78 has recesses that are difficult to place in contact with a conductive medium. It is therefore useful to take certain additional measures to promote heat transfer from the transformer 42B.

Figure 13:
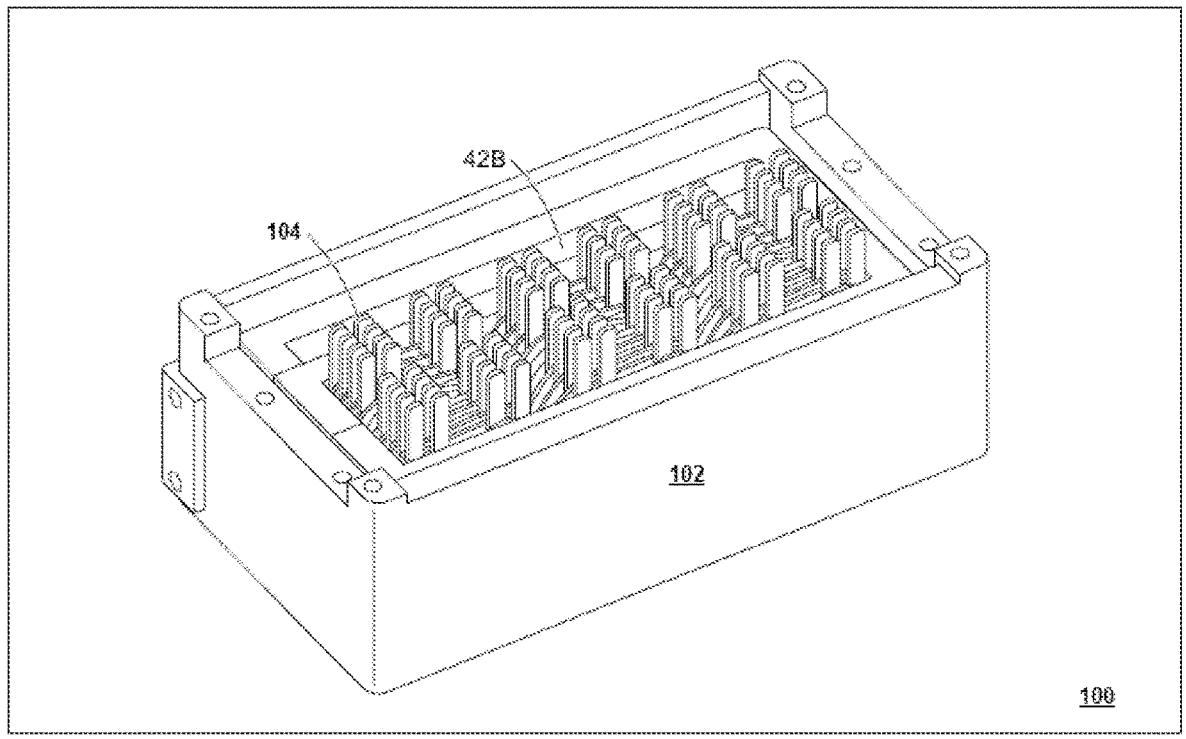
FIG. 13 shows a casing around the magnetic power-unit of FIG. 12.

To promote heat conduction, it is useful to immerse the transformer 42B in a polymer-filled tank 100, which is shown in FIG. 13 with its cap omitted to show its internal structure. The tank 100 comprises thermally conductive tank walls 102. Within the tank are additional heat-conducting strips 104 that further promote heat transfer to the tank walls 102.

Figure 14:
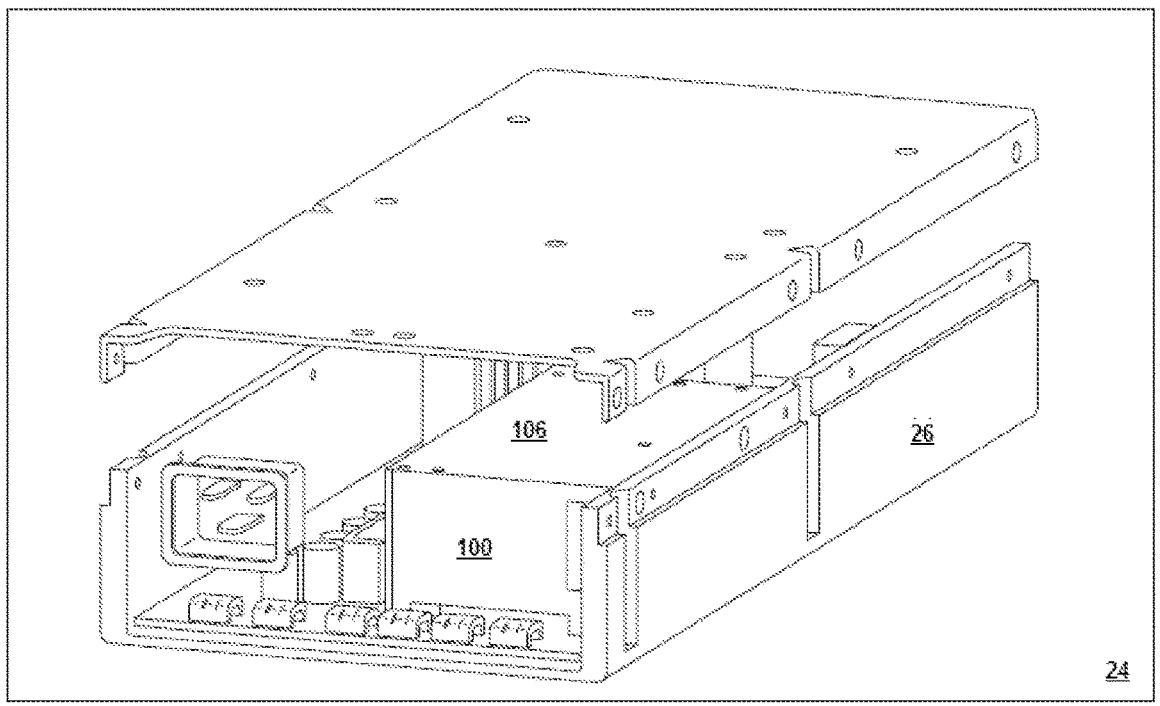
FIG. 14 shows the magnetic power-unit of FIG. 13 after having been encased.

FIG. 14 shows the power supply 24 of FIG. 12 with the transformer 42B now having been enclosed by the tank 100 shown in FIG. 13. In FIG. 14, the tank's cover 106 is shown as having dimensions commensurate with the tank 100. However, in some embodiments, the cover's dimensions are considerably larger than those of the tank 100, thus enabling heat from the tank 100 to be spread out over more of the housing 26.

Figure 15:
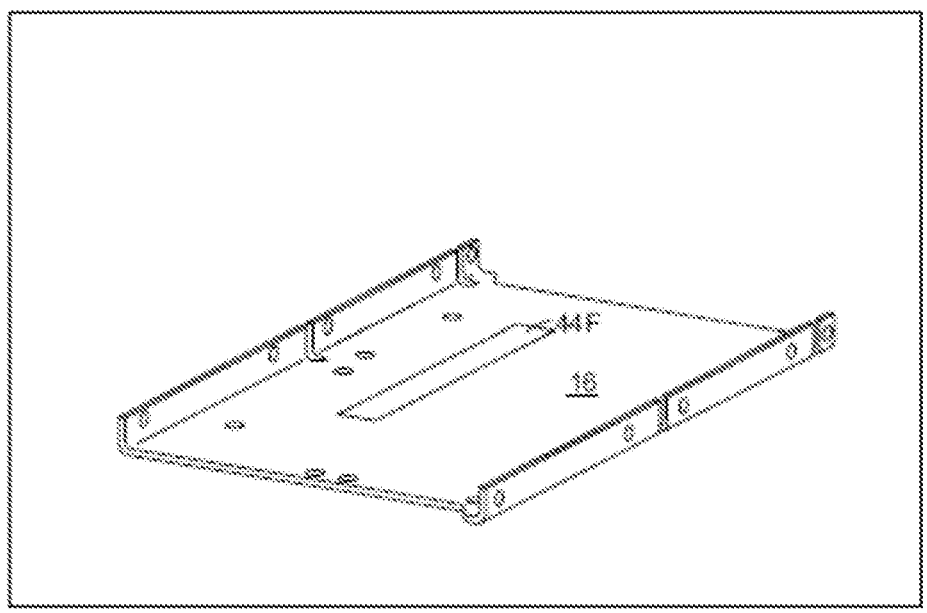
FIG. 15 shows an inlaid conductor in one of the faces of the housing of the power supply shown in FIG. 1

FIG. 15 shows example of a thermal resistor is a conducting strip 44F that has been inlaid into a recess on an inside surface of a face 28 of the housing 26. The material from which the conducting strip 44F is made is one whose conductivity is greater than that of the material from which the housing 26 is made. For an aluminum housing 26, suitable materials for the conducting strip 44F are copper or graphite. In the embodiment shown in FIG. 10, the conducting strip 44F has been strategically placed on the inside surface of the housing's roof so that it contacts one or more power units 42C.

It is to be understood that the foregoing description is intended to illustrate and not to limit the scope of the invention, which is defined by the scope of the appended claims. Other embodiments are within the scope of the following claims.

It should also be noted that the embodiments and the features in the embodiments of the utility model can be combined with each other without conflict. The utility model will be described in detail below with reference to the accompanying drawings and in conjunction with the embodiments.

What is claimed is:

1. An apparatus comprising an ac/dc power supply for providing power to a power consumer selected from the group consisting of servers in an internet data center and a stand-alone server, said power supply comprising power-handling circuitry and a passive heat-dissipation system that passively dissipates heat generated by said power-handling circuitry, wherein said passive heat-dissipation system comprises a housing that encloses said power-handling circuitry and a thermal network that provides solid-state thermally-conductive pathways between said power-handling circuitry and faces of said housing, wherein said faces of said housing comprise first and second faces, wherein said power-handling circuitry comprises a power-handling unit that is connected to said first and second faces of said housing by corresponding first and second solid-state thermally-conductive pathways, and wherein said thermal network comprises a grounded conducting plate that is between a power-handling unit of said power-handling circuitry and said housing.

2. The apparatus of claim 1, wherein said thermal network comprises a printed-circuit board and a heat-conductive medium disposed between said printed-circuit board and said housing.

3. The apparatus of claim 2, wherein said printed-circuit board has an opening, wherein said power-handling circuitry comprises a power unit, and wherein said power unit comprises a portion that passes through said opening so as to be in thermal communication with said housing.

4. The apparatus of claim 2, wherein said printed-circuit board is a multi-layer printed-circuit board comprising a plurality of heat-conducting layers and wherein said power-handling circuitry comprises a power unit that is surface mounted onto said printed-circuit board and that is in thermal communication with said heat-conducting layers.

5. The apparatus of claim 2, wherein said printed-circuit board is a multi-layer printed-circuit board comprising a plurality of heat-conducting layers, wherein said thermal network further comprises a metal plane in thermal communication with said printed-circuit board, and wherein said power-handling circuitry comprises a power unit that is surface mounted onto said printed-circuit board and that is in thermal communication with said heat-conducting layers.

6. The apparatus of claim 2, wherein said printed-circuit board is a multi-layer printed-circuit board comprising a plurality of heat-conducting layers, wherein said apparatus further comprises an electromagnetic-interference shield that is in thermal communication with said printed-circuit board, and wherein said power-handling circuitry comprises a power unit that is surface mounted onto said printed-circuit board and that is in thermal communication with said heat-conducting layers.

7. An apparatus comprising an ac/dc power supply for providing power to a power consumer selected from the group consisting of servers in an internet data center and a stand-alone server, said power supply comprising power-handling circuitry and a passive heat-dissipation system that passively dissipates heat generated by said power-handling circuitry, wherein said passive heat-dissipation system comprises a housing that encloses said power-handling circuitry and a thermal network that provides solid-state thermally-conductive pathways between said power-handling circuitry and faces of said housing, wherein said faces of said housing comprise first and second faces, wherein said power-handling circuitry comprises a power-handling unit that is connected to said first and second faces of said housing by corresponding first and second solid-state thermally-conductive pathways, and wherein said thermal network comprises an enclosure that surrounds said housing and a thermally-conductive and electrically-isolating medium that fills a gap between said enclosure and said housing, wherein said enclosure and said housing are at a common potential.

8. The apparatus of claim 2, wherein said thermal network comprises a projection that is in thermal communication with said housing and that projects into said housing, said projection comprising a thermally-conductive body having an end that is in thermal communication with a face of said housing, wherein said power-handling circuitry comprises a power unit that is disposed on said printed-circuit board and that is in thermal communication with said body, whereby heat generated by said power unit is conducted to said housing through said body.

9. The apparatus of claim 2, wherein said thermal network comprises a projection that is in thermal communication with said housing and that projects into said housing, wherein said projection comprises a recess, wherein said power-handling circuitry comprises a power unit that is disposed on said printed-circuit board, wherein said power unit is nestled in said recess, and wherein said recess conforms to said power unit.

10. The apparatus of claim 1, wherein said power consumer is one of the servers and said power supply is inside an enclosure of the server.

11. The apparatus of claim 2, wherein said thermal network comprises a thermally-conductive adhesive, wherein said power-handling circuitry comprises a power unit that is disposed on said printed-circuit board, wherein said power unit is in thermal communication with said adhesive, and wherein said adhesive is disposed between said power unit and said housing, whereby said power unit is in thermal communication with said housing via said adhesive.

12. The apparatus of claim 1, wherein said passive heat-dissipation system comprises a rack in the data center and wherein said housing of said power supply is in thermal communication with said rack such that heat conduction through solid takes place between said housing of said power supply and said rack in said data center.

13. The apparatus of claim 1, wherein said passive heat-dissipation system comprises an additional housing, wherein said additional housing encloses the power consumer in the data center, and wherein said housing is inside said additional housing and in thermal communication with said additional housing such that heat conduction through solid takes place between said additional housing and said housing.

14. The apparatus of claim 1, wherein said thermal network is in thermal communication with all of said faces of said housing.

15. The apparatus of claim 1, wherein said housing comprises opposed faces, each of which has a vent and wherein remaining faces of said housing are solid faces that are unperforated.

16. The apparatus of claim 1, further comprising fins on said housing.

17. The apparatus of claim 1, further comprising a warning system that provides an alert in response to detecting that a temperature of said housing exceeds a threshold value, said warning system comprising a heat sensor that senses a temperature of said housing.

18. The apparatus of claim 1, further comprising an access panel that is locked when a temperature of said housing is above a threshold and unlocked otherwise, wherein said access panel permits access to said power supply.

19. The apparatus of claim 1, wherein said power-handling circuitry comprises a power semiconductor device that is in thermal communication with said thermal network.

20. The apparatus of claim 2, wherein said power-handling circuitry comprises an electrolytic capacitor that is disposed on said printed-circuit board and wherein said electrolytic capacitor is in thermal communication with said thermal network.

21. The apparatus of claim 2, wherein said power-handling circuitry comprises a magnetic core and windings that disposed on said printed-circuit board and wherein said magnetic core and said windings are both in thermal communication with said thermal network.

22. The apparatus of claim 1, wherein said housing comprises walls that are no thinner than three millimeters.

23. The apparatus of claim 1, wherein said housing is configured to permit air flow to pass through said housing, said air flow being a result of kinetic energy that arises from outside said housing.

24. The apparatus of claim 1, wherein said power consumer is said stand-alone server.

25. An apparatus comprising an ac/dc power supply for providing power to a power consumer selected from the group consisting of servers in an internet data center and a stand-alone server, said power supply comprising power-handling circuitry and a passive heat-dissipation system that passively dissipates heat generated by said power-handling circuitry, wherein said passive heat-dissipation system comprises a housing that encloses said power-handling circuitry and a thermal network that provides solid-state thermally-conductive pathways between said power-handling circuitry and faces of said housing, wherein said faces of said housing comprise first and second faces, wherein said power-handling circuitry comprises a power-handling unit that is connected to said first and second faces of said housing by corresponding first and second solid-state thermally-conductive pathways, and wherein said thermal network comprises a printed-circuit board and graphene disposed between said printed-circuit board and said housing, said graphene being perforated and having thermally-conductive material filling said perforations.

26. The apparatus of claim 1, further comprising an emergency blower, a switch, and a thermocouple, wherein said blower is disposed inside said power supply and wherein said switch is configured to activate said blower in response to a measurement from said thermocouple.

27. The apparatus of claim 2, wherein said thermal network comprises a polymer-filled tank that is disposed on said printed-circuit board, wherein said tank comprises walls in contact with said housing, and wherein said power-handling circuitry comprises a transformer immersed in said tank.

28. The apparatus of claim 1, wherein said ac/dc power supply is rated to output at least three thousand watts of power during steady-state operation.

29. The apparatus of claim 14, wherein said faces are made of a material having a first thermal-conductivity that has been coated with a material of second thermal-conductivity, said second thermal-conductivity being greater than said first thermal-conductivity.

30. The apparatus of claim 1, further comprising a fan that provides a stream of moving air, wherein said power supply is disposed to intercept said moving air generated and whereby said power supply takes advantage of said moving air provided by said fan to cool said housing.

* * * * *